(12) United States Patent
Imafuji et al.

(10) Patent No.: US 9,485,864 B2
(45) Date of Patent: Nov. 1, 2016

(54) BUMP STRUCTURE, WIRING SUBSTRATE, SEMICONDUCTOR APPARATUS AND BUMP STRUCTURE MANUFACTURING METHOD

(71) Applicant: SHINKO ELECTRIC INDUSTRIES CO., LTD., Nagano-shi, Nagano (JP)

(72) Inventors: Kei Imafuji, Nagano (JP); Katsumi Yamazaki, Nagano (JP); Noritaka Katagiri, Nagano (JP); Teruaki Chino, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 97 days.

(21) Appl. No.: 14/328,765

(22) Filed: Jul. 11, 2014

(65) Prior Publication Data

US 2015/0029689 A1    Jan. 29, 2015

(30) Foreign Application Priority Data

Jul. 26, 2013 (JP) ................................. 2013-155615

(51) Int. Cl.
| | |
|---|---|
| H05K 1/11 | (2006.01) |
| H05K 1/18 | (2006.01) |
| H05K 3/34 | (2006.01) |
| H05K 3/40 | (2006.01) |

(52) U.S. Cl.
CPC ............. *H05K 1/111* (2013.01); *H05K 1/181* (2013.01); *H05K 3/3426* (2013.01); *H05K 3/4007* (2013.01); *H01L 2224/16225* (2013.01); *H05K 2201/09427* (2013.01); *H05K 2201/09745* (2013.01); *H05K 2201/09827* (2013.01); *H05K 2201/10704* (2013.01); *Y02P 70/611* (2015.11); *Y02P 70/613* (2015.11)

(58) Field of Classification Search
CPC .... H05K 1/111; H05K 1/181; H05K 3/3426; H05K 3/4007; H05K 2201/09427; H05K 2201/09827; H05K 2201/10704; H05K 2201/09745; H05K 1/18; H05K 3/30; H05K 3/303; H05K 3/341; H01B 5/00; Y02P 70/611; Y02P 70/613; H01L 2224/16225
USPC ................. 174/250–268; 361/760, 792–795; 257/737, 778
See application file for complete search history.

(56) References Cited

U.S. PATENT DOCUMENTS

| | | | | |
|---|---|---|---|---|
| 6,497,943 | B1 * | 12/2002 | Jimarez .................. | B32B 15/08 174/255 |
| 6,992,379 | B2 * | 1/2006 | Alcoe .................. | H01L 23/3735 174/255 |
| 2009/0183911 | A1 * | 7/2009 | Sunohara ............... | H05K 3/326 174/267 |
| 2009/0184420 | A1 | 7/2009 | Choi et al. | |
| 2010/0200279 | A1 * | 8/2010 | Kariya .................. | H01L 21/486 174/255 |

FOREIGN PATENT DOCUMENTS

| | | |
|---|---|---|
| JP | A-H01-226160 | 9/1989 |
| JP | 2009-177118 A | 8/2009 |

* cited by examiner

*Primary Examiner* — Ishwarbhai B Patel
(74) *Attorney, Agent, or Firm* — Drinker Biddle & Reath LLP

(57) ABSTRACT

A bump structure provided on an electrode pad includes a solder member, and a metal layer having a cylindrical portion covering a side surface of the solder member, the metal layer being made of a metal which is higher in melting point than the solder member. An upper part of the cylindrical portion of the metal layer is opened wide.

3 Claims, 15 Drawing Sheets

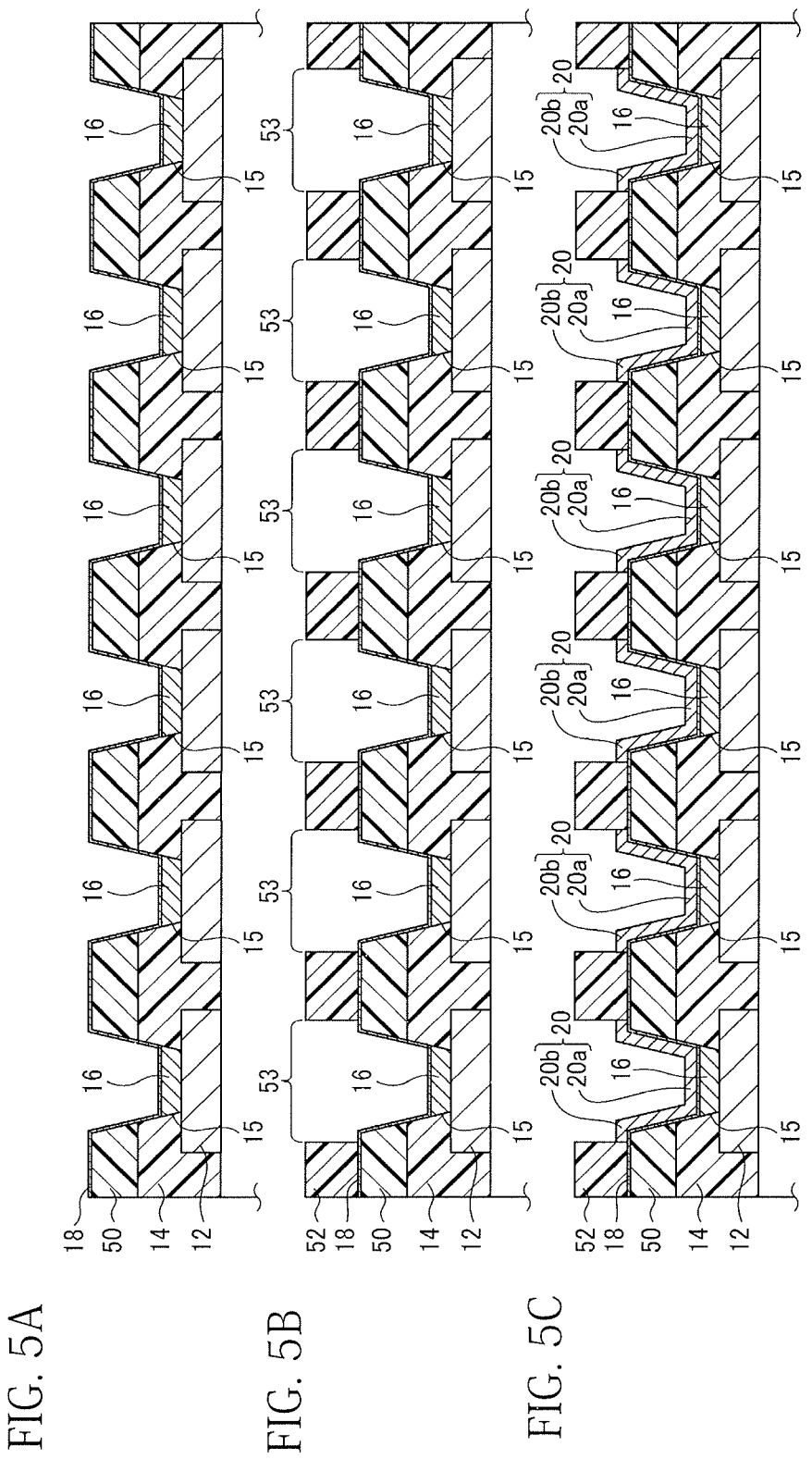

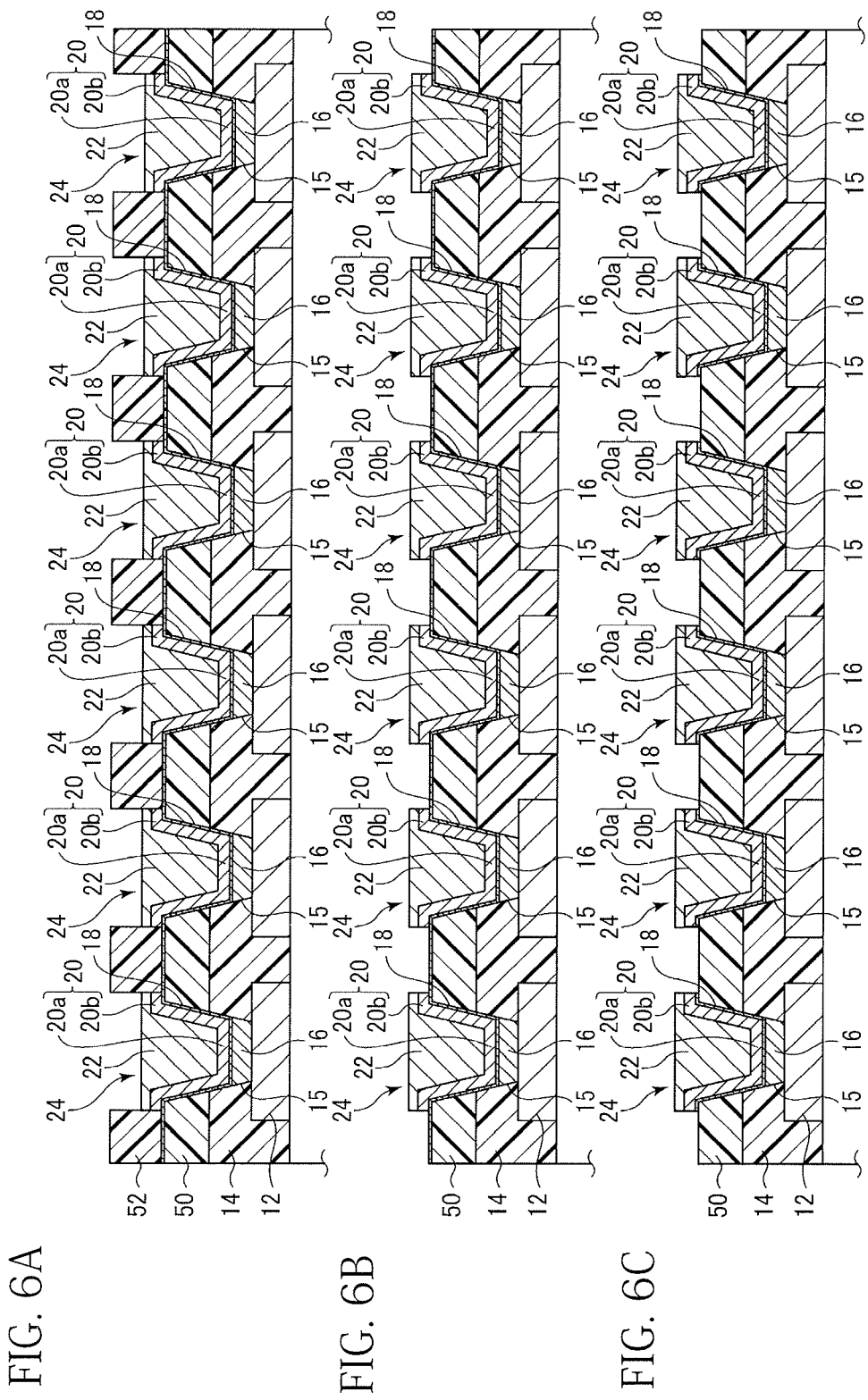

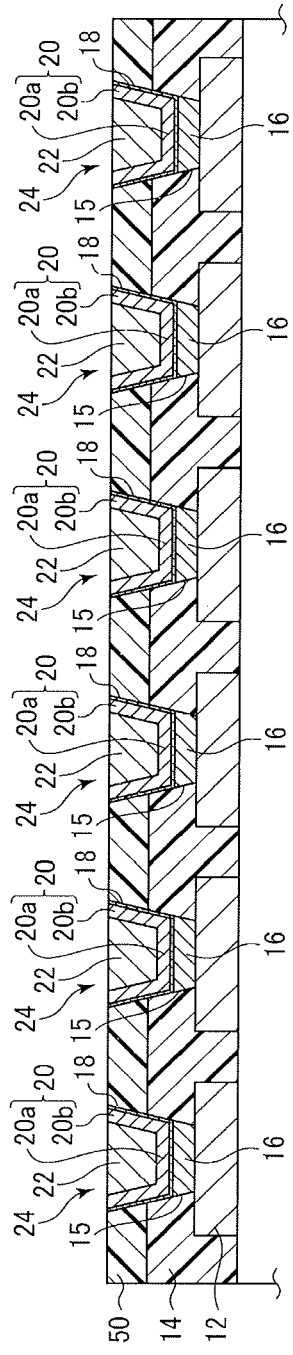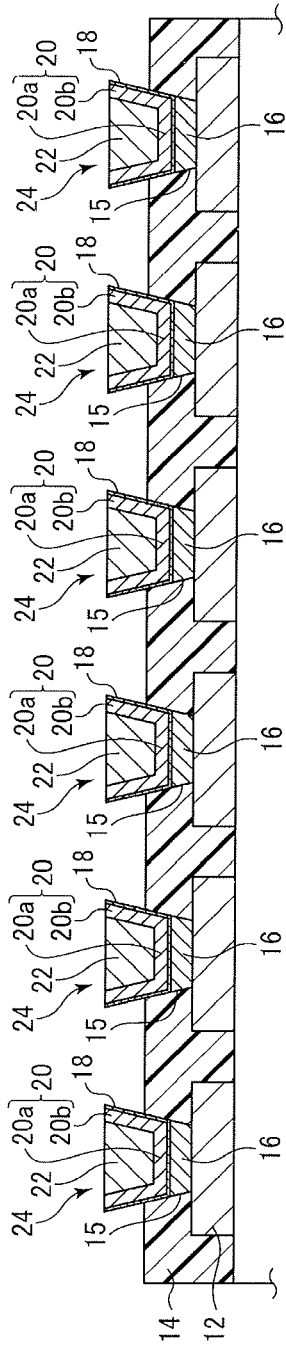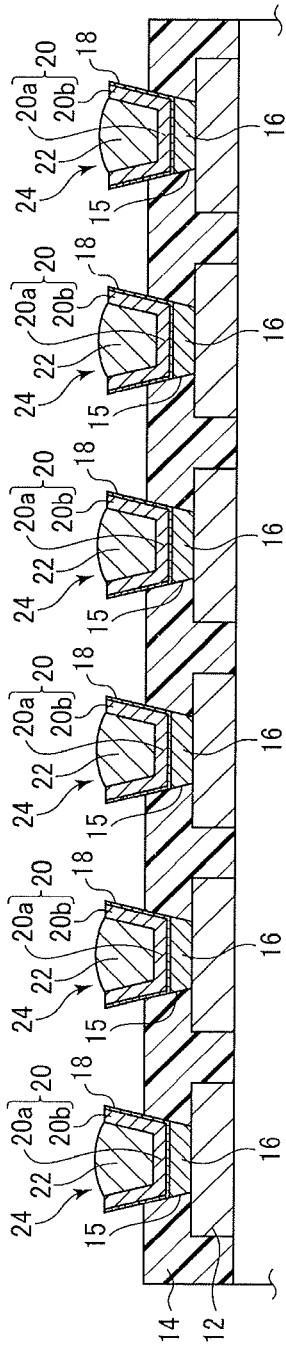
FIG. 7A
FIG. 7B
FIG. 7C

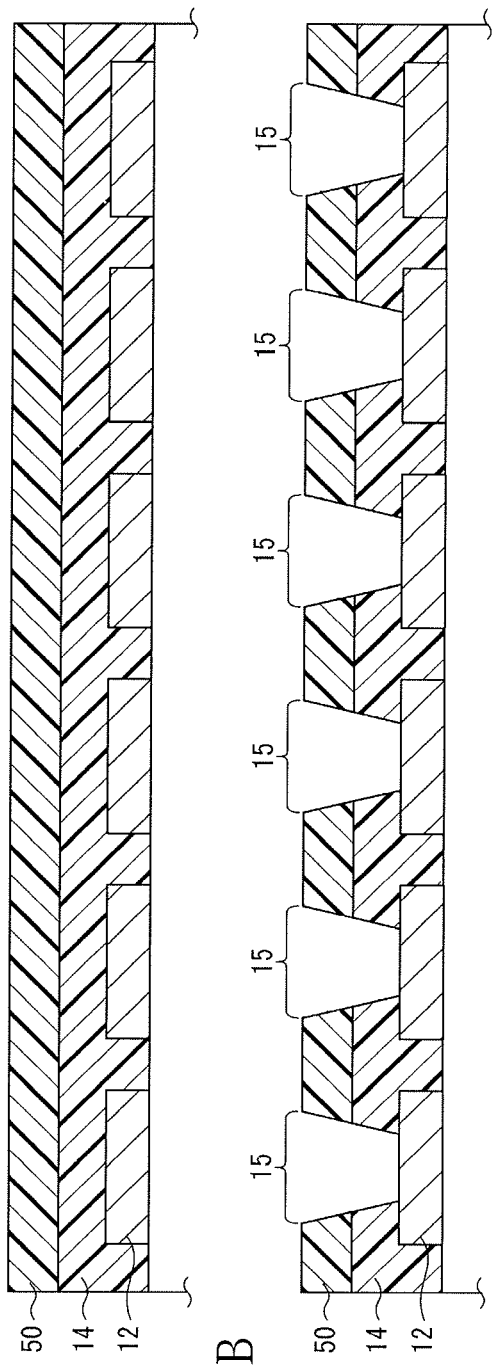

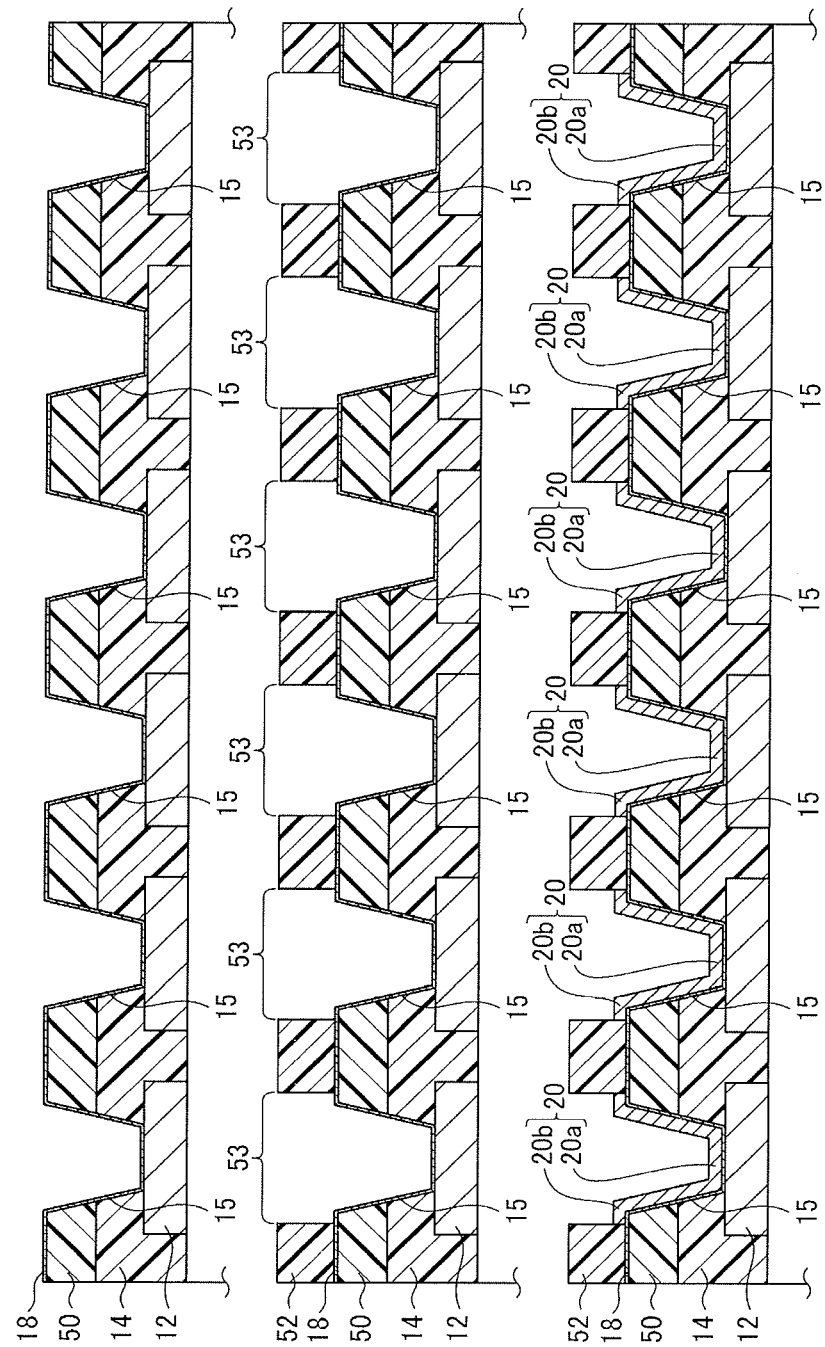

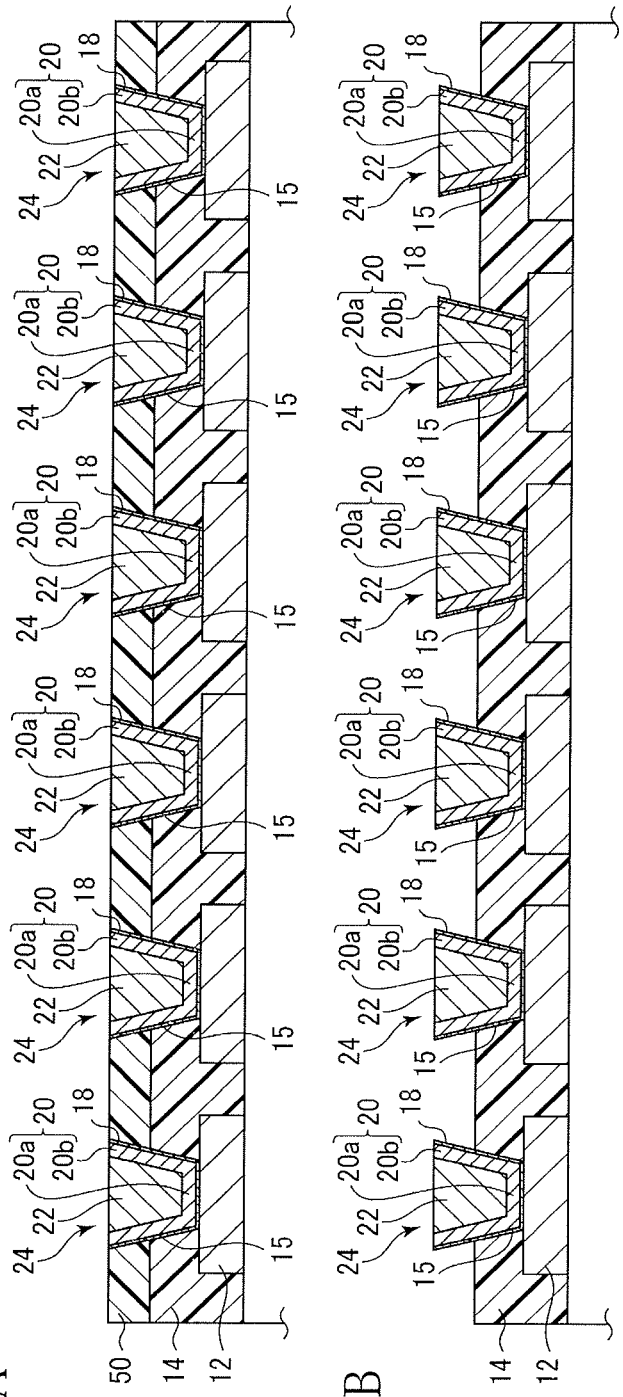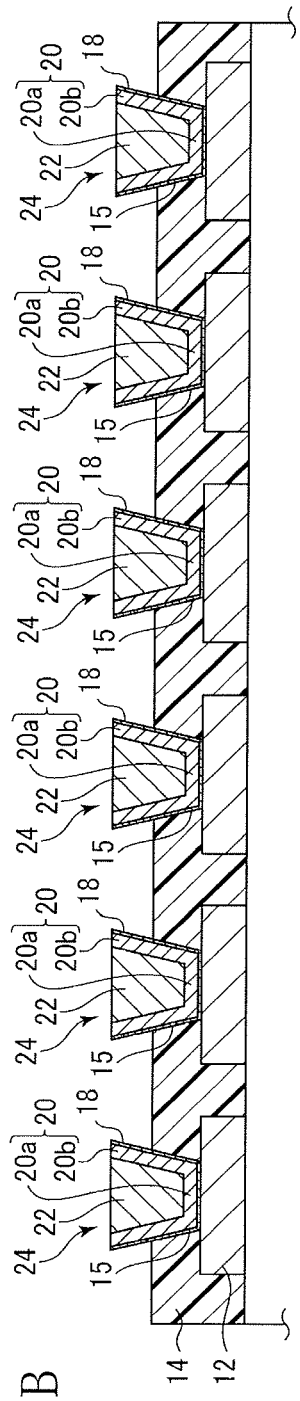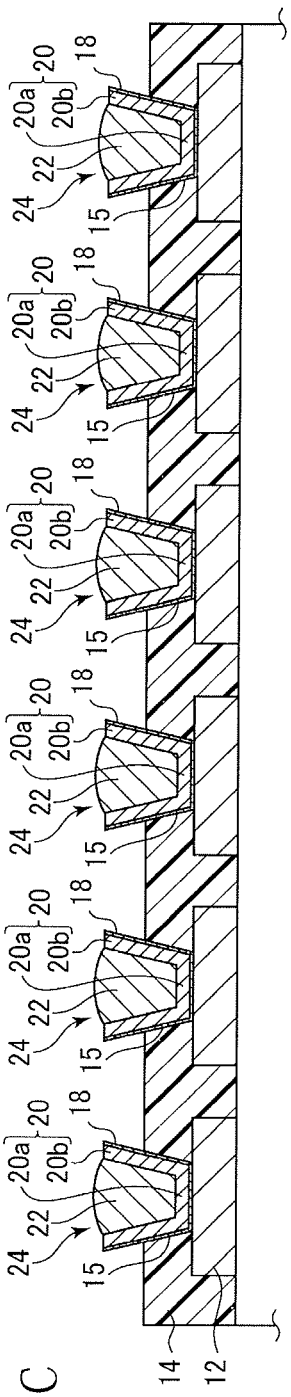
FIG. 13A
FIG. 13B
FIG. 13C

BUMP STRUCTURE, WIRING SUBSTRATE, SEMICONDUCTOR APPARATUS AND BUMP STRUCTURE MANUFACTURING METHOD

CROSS-REFERENCE TO RELATED APPLICATION(S)

The present application claims the benefit of priority of Japanese Patent Application No. 2013-155615 filed on Jul. 26, 2013. The disclosures of the application are incorporated herein by reference.

BACKGROUND

1. Technical Field

The present invention relates to a bump structure, a wiring substrate, a semiconductor apparatus, and a bump structure manufacturing method.

2. Related Art

Recently, the advancement and the complication of electronic products have reduced the pitches of bumps of electronic elements. As a method of forming narrow pitch bumps of a semiconductor chip, whose bump pitch is small, a technique is known in which a copper post is formed on each electrode pad on a semiconductor chip and in which an opening on each copper post is filled with solder (see JP-A-2009-177118).

However, in a related-art bump structure, when a semiconductor chip is mounted on a wiring substrate, sometimes, solder is crushed, and a bridge occurs between adjacent bumps.

SUMMARY

Exemplary embodiments of the invention provides a bump structure, a wiring substrate, a semiconductor apparatus, and a method of manufacturing a bump structure, each of which can prevent occurrence of a bridge between bumps.

A bump structure provided on an electrode pad according to an exemplary embodiment of the invention, comprises:
a solder member; and
a metal layer having a cylindrical portion covering a side surface of the solder member, the metal layer being made of a metal which is higher in melting point than the solder member, wherein
an upper part of the cylindrical portion of the metal layer is opened wide.

A method of manufacturing a bump structure provided on an electrode pad, according to an exemplary embodiment, comprises:
forming a first resin layer on the electrode pad;
forming, on the first resin layer, a second resin layer differing in peeling-property from the first resin layer;
forming, in each of the first resin layer and the second resin layer, a first opening whose upper part is opened wide;
forming, on an inner wall of the first opening, a metal layer made of a metal which is higher in melting-point than a solder member;
filling the solder member in the metal layer; and
removing the second resin layer.

According to a bump structure, a wiring substrate, a semiconductor apparatus, and a method of manufacturing a bump structure of the exemplary embodiments, it is possible to prevent occurrence of defects such as a bridge between the adjacent bumps.

BRIEF DESCRIPTION OF THE DRAWINGS

FIGS. 4A to 7C are process cross-sectional diagrams illustrating a method of manufacturing the bump structure according to the first embodiment.

FIGS. 10A to 13C are process cross-sectional diagrams illustrating a method of manufacturing the bump structure according to the second embodiment.

DETAILED DESCRIPTION

First Embodiment

A bump structure according to a first embodiment is described with reference to FIGS. 1 to 7C.

Wiring Substrate

Figure 1:
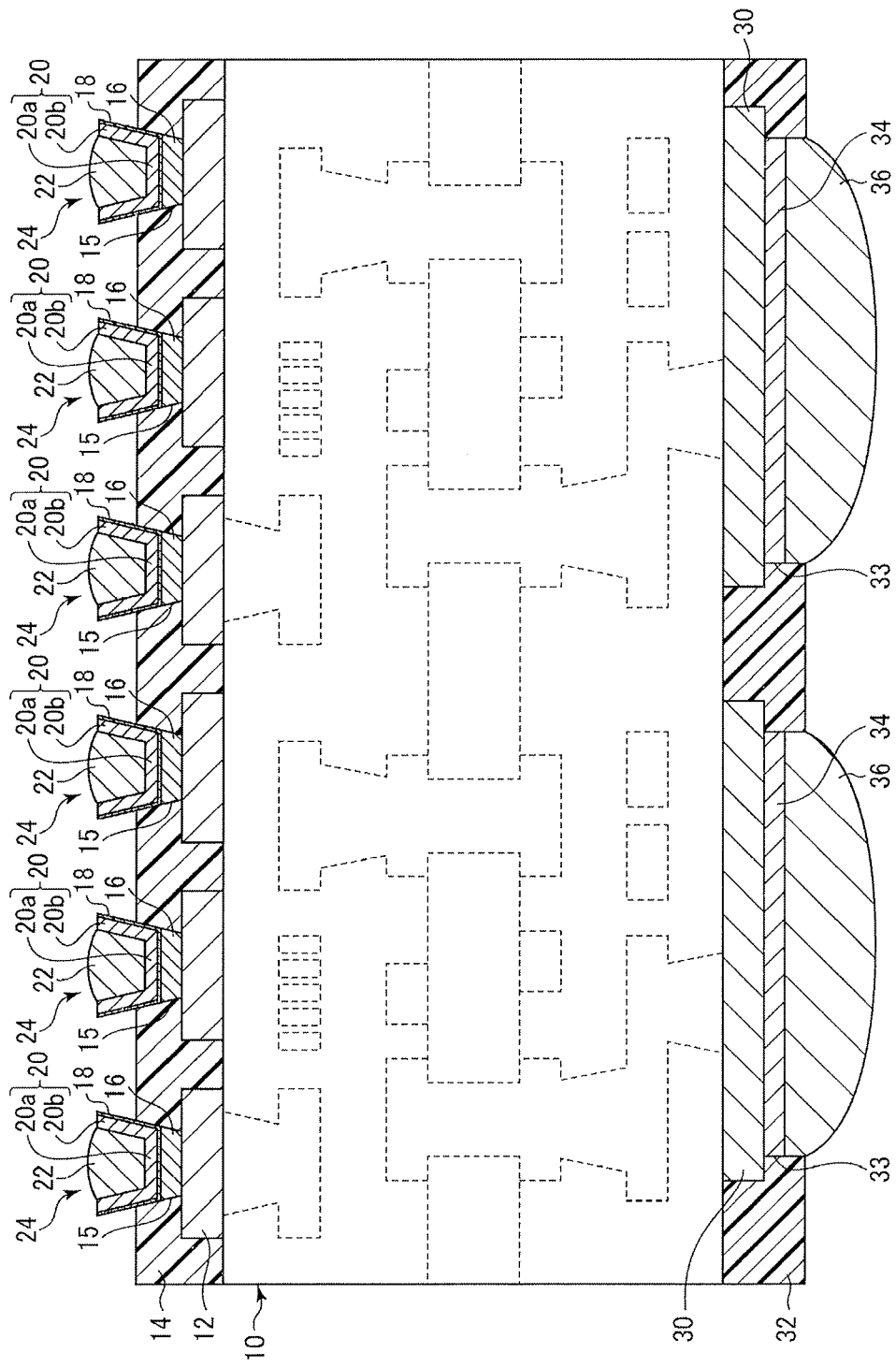
FIG. 1 is a cross-sectional diagram illustrating a wiring substrate having a bump structure according to a first embodiment.

A wiring substrate having a bump structure according to the first embodiment is described with reference to FIG. 1. FIG. 1 is a cross-sectional diagram illustrating a wiring substrate having a bump structure according to the present embodiment.

A wiring substrate 10 is a buildup substrate using, e.g., an insulating layer made of resin, and a core substrate. Electrode pads 12 and 30 are provided on an insulating layer. An internal structure of the wiring substrate 10 is indicated with dashed lines in FIG. 1. Thus, the detailed description of the internal structure is omitted.

Incidentally, the internal structure of the wiring substrate 10 is not limited to that illustrated in FIG. 1. Any structure may be used as the internal structure of the wiring substrate 10. For example, various wiring substrates such as a coreless substrate may be used as the wiring substrate 10.

In FIG. 1, the top surface of the wiring substrate 10 is a chip-mounting-surface on which a semiconductor chip (not shown) is mounted. The bottom surface of the wiring substrate 10 is a motherboard-connection-surface connected to a motherboard (not shown).

Plural electrode pads 12 are formed on a chip-mounting-surface of the wiring substrate 10 at a small pitch compatible with the pitch of plural electrode posts (not shown) of a semiconductor chip (not shown) to be mounted.

The electrode pads 12 are formed, e.g., circularly. The electrode pads 12 are, e.g., 50 micrometers (μm) in diameter. The diameter of the electrode pads 12 may be within a range of 30 μm to 100 μm. The electrode pads 12 are 15 μm in thickness. The thickness of the electrode pads 12 may be within a range of 5 μm to 20 μm.

The pitch of the plural electrode pads 12 is, e.g., 75 μm and may be within a range of 60 μm to 120 μm.

The electrode pads 12 are made of copper, copper alloy or the like.

On the chip-mounting-surface of the wiring substrate 10, an insulating resin layer 14 is formed so as to cover the entire electrode pads 12. The thickness of the insulating layer 14 on the surface of each electrode pad 12 is 15 μm. The insulating layers 14 are formed of a permanent resist made of an epoxy-based resin or acryl-based resin such as a solder resist.

An opening 15 tapered to be opened wide at an upper part is formed on each electrode pad 12 in the insulating resin layer 14.

In the tapered-shape opening 15 in the insulating resin layer 14, electrically conductive layers 16 are formed on the electrode pads 12, respectively. The electrically-conductive layer 16 is a Ni/Pd/Au plating layer which Ni-layer, Pd-layer, and Au-layer are sequentially stacked by the electroless plating from the bottom side as viewed in FIG. 1. The thickness of Ni-layer is, e.g., 5 μm and may be within a range of 0.05 μm to 10 μm. The thickness of Pd-layer is, e.g., 0.1 μm and may be within a range of 0.02 μm to 0.2 μm. The thickness of Au-layer is, e.g., 0.1 μm and may be within a range of 0.01 μm to 0.5 μm.

Each metal layer 20 is formed via a seed layer 18 on an electrically-conductive layer 16 in the tapered-shape opening 15 in the insulating resin layer 14 and on the side wall of the opening 15. Each of the seed layer 18 and the metal layer 20 is such that the bottom side thereof is embedded in the insulating resin layer 14 and that the top side thereof is protruded upwardly from the insulating resin layer 14.

The metal layer 20 includes a bottom portion 20a and a cylindrical portion 20b that is formed integrally with the bottom portion 20a and opened wide at an upper part. A solder member (solder bump) 22 is formed by filling the inside of the cylindrical portion 20b of the metal layer 20 with solder.

The solder member 22 is shaped like an inverted truncated-cone in conformity with the shape of the cylindrical portion 20b whose upper part is opened wide.

The metal layer 20 is, e.g., 2 μm in thickness and may be within a range of 0.5 μm to 5 μm in thickness.

The seed layer 18 is, e.g., 0.5 μm in thickness and may be within a range of 0.2 μm to 2 μm in thickness.

The shape of the cylindrical portion 20b of the metal layer 20, which is widened upward, is a tapered-shape configured such that, e.g., the diameter of a bottom outer-circumference is 40 μm, the diameter of a top outer-circumference is 55 μm, a height is 40 μm, and a spread-angle is 10 degrees.

The shape of the cylindrical portion 20b of the metal layer 20, which is widened upward, may be a tapered-shape configured such that the diameter of a bottom outer-circumference is within a range of 30 μm to 60 μm, the diameter of a top outer-circumference is within a range of 40 μm to 100 μm, a height is within a range of 25 μm to 60 μm, and a spread-angle is within a range of 5 degrees to 30 degrees.

The solder of the solder member 22 is, e.g., Sn, Sn—Zn alloy, Sn—Cu alloy, Sn—In alloy, Sn—Ag alloy, or the like.

The metal layer 20 is formed using a metal whose melting point is higher than the eutectic point (melting point) of the solder member 22. The metal layer 20 is made of metal, e.g., Ni, Co, or the like.

For example, if the solder member 22 is Sn, the metal layer 20 is made of metal, e.g., Ni, whose melting point is higher than 232 degrees centigrade (° C.) which is the melting point of Sn. The seed layer 18 is made of Cu.

Thus, on a surface of the wiring substrate 10, on which a semiconductor chip is mounted, plural bump structures 24 each including the metal layer 20 and the solder member 22, with which the inside of the metal layer 20 is filled, are formed.

On the motherboard-connection-surface of the wiring substrate 10, which is connected to the motherboard, plural electrode pads 30 are formed at a pitch compatible with the pitch of plural electrodes (not shown) of the motherboard (not shown) on which the wiring substrate 10 is mounted.

The electrode pads 30 are made of, e.g. copper, copper alloys, or the like. The electrode pads 30 are 15 μm in thickness. The thickness of the electrode pads 30 may be within a range of 5 μm to 20 μm. Each electrode pad 30 is, e.g., 200 μm in diameter. The diameter of each electrode pad 30 may be within a range of 50 μm to 1000 μm.

The pitch of the plural electrode pads 30 is compatible with the pitch of plural electrodes (not shown) of the motherboard (not shown) and within in a range of, e.g., 300 μm to 1500 μm.

An insulating layer 32 is formed on the surface of the wiring substrate 10, which is connected to the motherboard to cover the electrode pads 30. The thickness of the insulating layer 32 from the surface of each electrode pad 30 is 15 μm. The insulating layer 32 is formed of a permanent resist made of an epoxy-based resin or acryl-based resin such as a solder resist.

An opening 33 is formed on each electrode pad 30 in the insulating layer 32. An electrically-conductive layer 34 is formed on each electrode pad 30.

The electrically-conductive layer 34 is configured similarly to the electrically-conductive layer 16 on the surface of the wiring substrate 10, on which the chip is mounted. For example, in FIG. 1, the electrically-conductive layer 34 is a Ni/Pd/Au plating layer in which Ni-layer, Pd-layer, and Au-layer are stacked sequentially from the top side. The thickness of Ni-layer is, e.g., 5 μm and may be within a range of 0.05 μm to 10 μm. The thickness of Pd-layer is, e.g., 0.1 μm and may be within a range of 0.02 μm to 0.2 μm. The thickness of Au-layer is, e.g., 0.1 μm and may be within a range of 0.01 μm to 0.5 μm.

A solder member (solder bump) 36 is formed on each electrically-conductive layer 34. The solder of the solder member 36 is, e.g., Sn, Sn—Zn alloy, Sn—Cu alloy, Sn—In alloy, Sn—Ag alloy, or the like.

Incidentally, the electrically-conductive layers 16 and 34 are not limited to the above Ni/Pd/Au plating layers.

For example, the electrically-conductive layers 16 and 34 may be Ni/Au plating layers in each of which Ni-layer and Au-layer are stacked. The thickness of Ni-layer is, e.g., 5 μm and may be within a range of 0.05 μm to 10 μm. The thickness of Au-layer is, e.g., 0.05 μm and may be within a range of 0.01 μm to 0.5 μm.

Alternatively, the electrically-conductive layers 16 and 34 may be Au-plating-layers. The thickness of Au-plating-layer is, e.g., 0.05 μm and may be within a range of 0.01 μm to 0.5 μm.

Alternatively, the electrically-conductive layers 16 and 34 may be Pd/Au plating layers in each of which Pd-layer and Au-layer are stacked. The thickness of Pd-layer is, e.g., 0.1 μm and may be within a range of 0.02 μm to 0.2 μm. The thickness of Au-layer is, e.g., 0.05 μm and may be within a range of 0.01 μm to 0.5 μm.

Alternatively, the electrically-conductive layers 16 and 34 may be Ag plating layers. The thickness of Ag-layer is, e.g., 0.1 μm and may be within a range of 0.02 μm to 0.5 μm.

Semiconductor Apparatus

Figure 2:
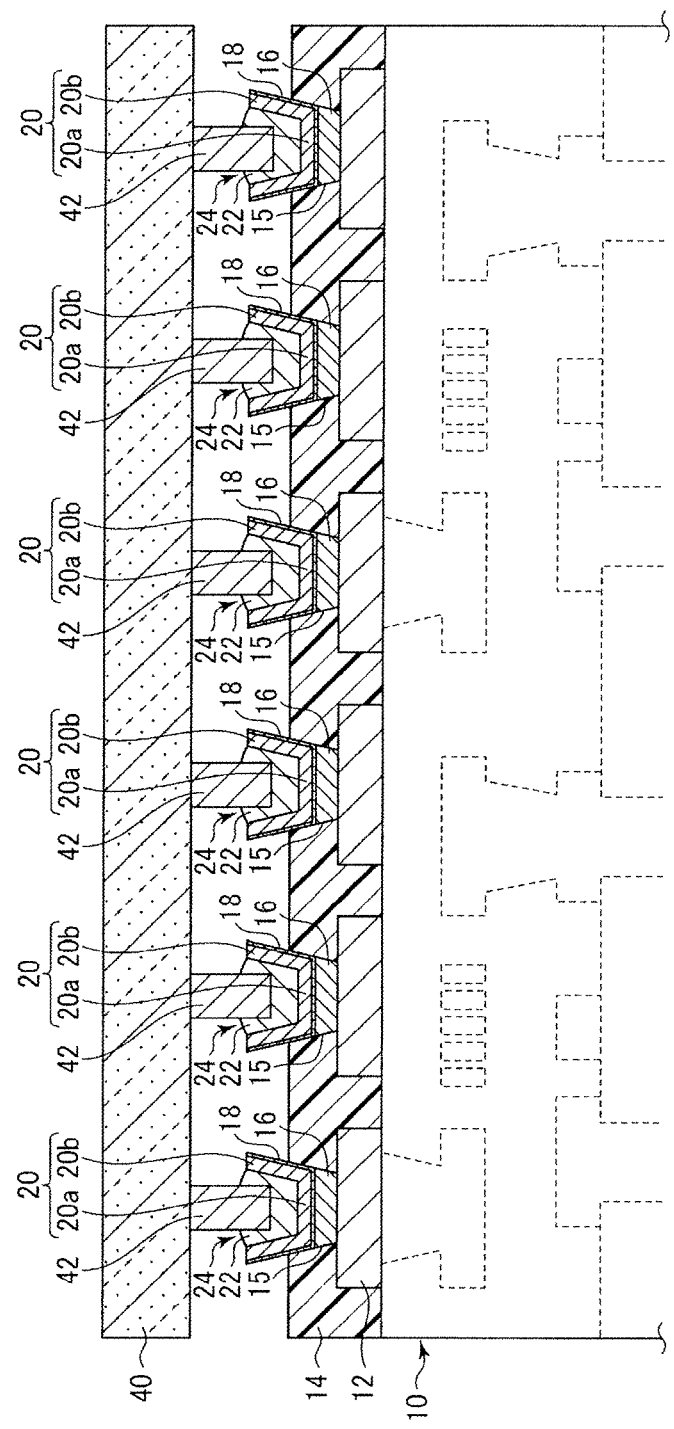
FIG. 2 is a cross-sectional diagram illustrating a semiconductor apparatus configured such that a semiconductor chip is mounted on the wiring substrate having the bump structure according to the first embodiment.

A semiconductor apparatus configured by mounting a semiconductor chip on a wiring substrate having a bump structure according to the present embodiment is described below with reference to FIG. 2. FIG. 2 is a cross-sectional diagram illustrating a semiconductor apparatus configured such that a semiconductor chip is mounted on a wiring substrate having a bump structure according to the present embodiment.

As illustrated in FIG. 2, plural electrode posts 42 are formed at a small pitch on a semiconductor chip 40 to be mounted. The electrode post 42 is, e.g., a columnar electrode post formed by copper-plating or the like.

The plural electrode pads 12 on the chip-mounting-surface of the wiring substrate 10 are formed at a pitch such that this pitch is compatible with the pitch of the plural electrode posts 42 of the semiconductor chip 40. The plural bump structures 24 each including the metal layer 20 and the solder member 22 are respectively formed on the plural electrode pads 12 so that the pitch of the plural bump structures 24 is compatible with the pitch of the plural electrode posts 42 on the semiconductor chip 40.

The plural electrode posts 42 on the semiconductor chip 40 are respectively joined to the plural bump structures 24 on the wiring substrate 10.

Thus, a semiconductor apparatus is formed by mounting the semiconductor chip 40 on the wiring substrate 10.

As described above, according to the present embodiment, each solder member 22 is covered around with the metal layer 20 whose melting point is higher than the melting point of solder. Thus, when the electrode posts 42 on the semiconductor chip 40 are respectively connected to the solder members 22, the molten solder member 22 can be prevented from being crushed and being laterally spread. In addition, because the solder member 22 is covered around with the metal layer 20, the growth of whisker due to the recrystallization of solder can be suppressed. Accordingly, the adjacent solder members 22 can be prevented electrically connected and short-circuited by the crushed solder member 22 or the whisker growing from the solder member 22.

It is desirable that the plural electrode pads 12 on the chip-mounting-surface of the wiring substrate 10, and the solder members 22 are formed at a small pitch with good accuracy so as to be compatible with the pitch of the electrode posts 42 on the semiconductor chip 40 to be mounted. However, a manufacturing error may occur. According to the present embodiment, each solder member 22 is tapered to be widened upward. Thus, a substantial joint part is large. Accordingly, even if a deviation of a formation-position, at which each bump structure 24 is formed, from the corresponding electrode post 42 on the semiconductor chip 40 occurs, each bump structure 24 can favorably be connected to the corresponding electrode 42.

Figure 3:
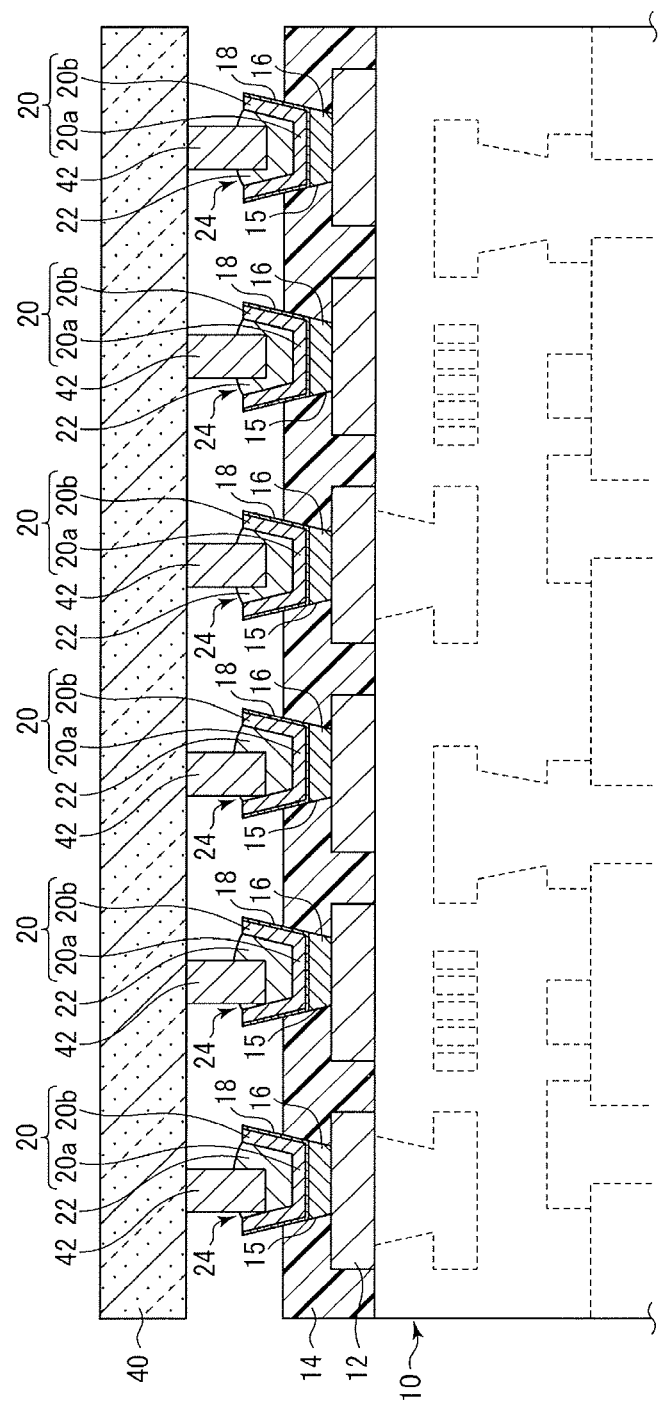
FIG. 3 is a cross-sectional diagram illustrating the semiconductor apparatus according to the first embodiment when a manufacturing error occurs.

For example, even if the formation-positions, at which three solder members 22 on a left-side part of the wiring substrate 10 are respectively formed, are deviated rightward from the proper formation-positions, as viewed in FIG. 3, the solder members 22 can be respectively connected to the electrode posts 42 on the semiconductor chip 40, as long as the deviation of each formation-position is within a range of the widened upper part of each of the solder members 22.

According to the present embodiment, each solder member 22 is tapered to be widened upward. Thus, the substantial joint part of each solder member 22 is large. Consequently, the accuracy of the position adjustment of the wiring substrate 10 and the semiconductor chip 40 can be alleviated.

In recent years, with reduction in thickness of the wiring substrate 10, the warpage of the wiring substrate 10 has become more likely to occur. When the wiring substrate 10 is warped, the plural solder members 22 on the wiring substrate 10 become uneven in height. Thus, the semiconductor chip 40 is moved closer to the wiring substrate 10 so that all the electrode posts 42 are connected to the solder members 22. According to the present embodiment, even if the semiconductor chip 40 is put closer to the wiring substrate 10, the solder members 22 can be prevented by the cylindrical portion 22b of the metal layer 20 from being crushed and spread laterally. Consequently, the adjacent solder members 22 can be prevented from being electrically connected and short-circuited.

In addition, even when the wiring substrate 10 is warped, the top surfaces of the plural solder members 22 formed on the wiring substrate 10 can be made flush with one another if the bump structures are manufactured by a manufacturing method to be described below. Accordingly, the semiconductor chip 40 can favorably be connected to the wiring substrate 10.

Bump Structure Manufacturing Method

A manufacturing method for a bump structure according to the present embodiment is described below with reference to FIGS. 4A to 7C. FIGS. 4A to 7C are process cross-sectional diagrams illustrating a method of manufacturing a bump structure according to the present embodiment.

Figure 4A:
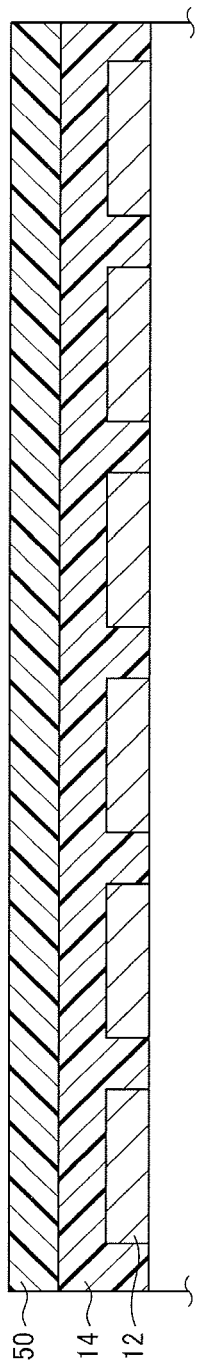

First, an insulating resin layer 14 is formed to cover the entire electrode pads 12 serving as an outermost layer of the wiring substrate 10 (see FIG. 4A). The thickness of the insulating resin layer 14 on the surface of each electrode pad 12 is 15 μm.

Next, on the insulating resin layer 14, an insulating resin layer 50 is formed, which differs from the insulating layer 14 in peeling-property (see FIG. 4A). The thickness of the insulating resin layer 50 is, e.g., 30 μm and may be within a range of 15 μm to 50 μm.

If a resin capable of being peeled by a certain solvent is used as the insulating resin layer 50, a resin hard to peel with this solvent is used as the insulating resin layer 14. The reason for forming the insulating resin layer 50 differing in peeling-property from the insulating resin layer 14 is that the insulating resin layer 50 is made to selectively be peeled in a post process.

If, e.g., a solder resist is used as the material of the insulating resin layer 14, e.g., an epoxy-based thermosetting resin can be used as the material of the insulating resin layer 50. The insulating resin layer 50 can be peeled by, e.g., an organic solvent. However, the insulating resin layer 14 is difficult to be peeled by an organic solvent.

Figure 4B:
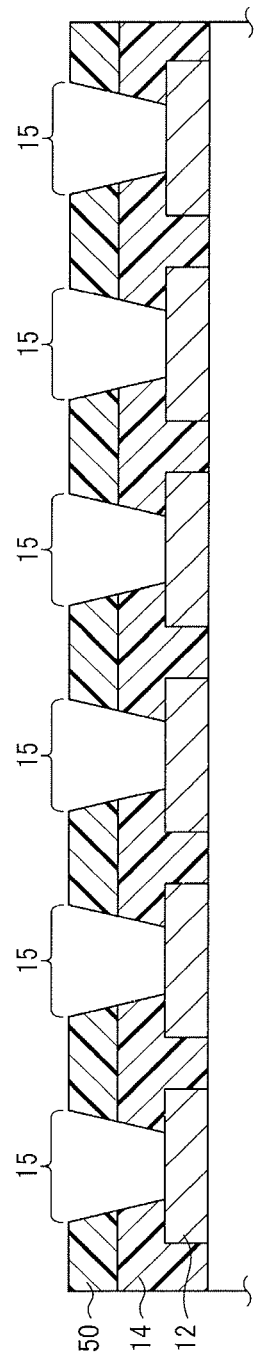

Next, the opening 15 penetrating through the insulating resin layers 14 and 50 and reaching the electrode pad 12 is formed by laser processing (see FIG. 4B). Subsequently, a desmear treatment for removing a smear (i.e., a resin residue) generated by laser processing is performed. The desmear treatment is to remove a smear (i.e., a resin residue) using, e.g., a permanganic acid solution.

A laser-beam is attenuated in a depth direction. Thus, the shape of the opening 15 formed by laser processing is a tapered-shape whose upper part is opened wide, as illustrated in FIG. 4A. The laser processing is performed using, e.g., a carbon dioxide laser.

The shape of the opening 15 widened upward is such that the diameter of a bottom part of the opening 15 is 40 µm, that the diameter of an upper part is 55 µm, and that the spread-angle is 10 degrees.

The shape of the opening 15 widened upward is a tapered-shape configured such that the diameter of the bottom is within a range of 30 µm to 60 µm, that the diameter of the top is within a range of 40 µm to 100 µm, and that the spread-angle is within a range of 5 degrees to 30 degrees.

Figure 4C:
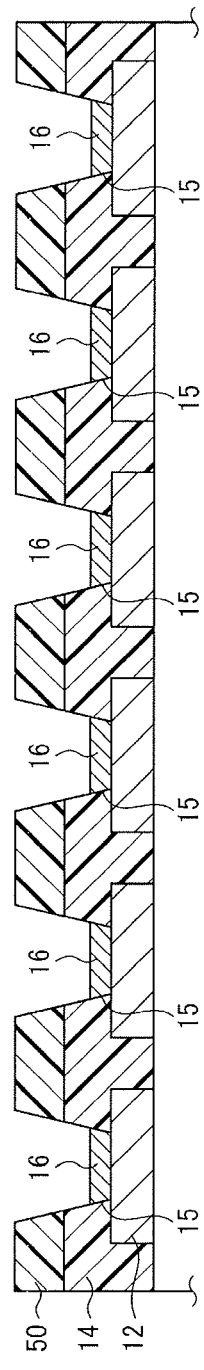

Next, the electrically-conductive layer 16 is formed on the electrode pad 12 in each opening 15 (see FIG. 4C).

Incidentally, the electrically-conductive layers 16 are formed concurrently when the electrically-conductive layers 34 are respectively formed on the electrode pads 30 on the surface of the wiring substrate 10, which is connected to the motherboard. Therefore, the electrically-conductive layers 16 are not formed if the electrically-conductive layers 34 are respectively formed on the electrode pads 30 on the surface of the wiring substrate 10, which is connected to the motherboard, in a state in which the surface of the wiring substrate 10, on which the semiconductor chip is mounted, is masked. According to the present embodiment, the electrically-conductive layers 34 are respectively formed on the electrode pads 30 on the surface of the wiring substrate 10, which is connected to the motherboard, in a state in which the surface of the wiring substrate 10, on which the semiconductor chip is mounted, is not masked. Consequently, the electrically-conductive layers 16 are formed on the electrode pads 12, respectively.

The electrically-conductive layers 16 are Ni/Pd/Au plating layers in each of which Ni-layer, Pd-layer, and Au-layer are sequentially stacked by the electroless plating from the bottom side, as viewed in FIGS. 4A to 4C. The electrically-conductive layers 34 concurrently formed are Ni/Pd/Au plating layers in each of which Ni-layer, Pd-layer, and Au-layer are sequentially stacked by the electroless plating from the top side, as viewed in FIG. 1.

The thickness of Ni-layer is, e.g., 5 µm and may be within a range of 0.05 µm to 10 µm. The thickness of Pd-layer is, e.g., 0.1 µm and may be within a range of 0.02 µm to 0.2 µm. The thickness of Au-layer is, e.g., 0.1 µm and may be within a range of 0.01 µm to 0.5 µm.

Next, the seed layer 18 is formed on the entire surface of each electrically-conductive layer 16 (see FIG. 5A). The seed layer 18 is formed by, e.g., electroless plating on the top surface of the insulating resin layer 50, the inner side surface of the opening 15 of the insulating resin layer 50, the inner side surface of the opening 15 of the insulating resin layer 14, and the top surface of the electrically-conductive layer 16.

The seed layer 18 is made of, e.g., copper, copper alloy, or the like. The thickness of the seed layer 18 is 0.5 µm and may be within a range of 0.2 µm to 2 µm.

Next, the entire surface of the seed layer 18 is coated with a dry film resist (DFR) 52. Then, patterning is performed on the dry film resist 52 to cover with exposure and development the top surface of the seed layer 18 on the insulating resin layer 50 and to form an opening 53 from which a region including the opening 15 on the electrode pad 12 is exposed (see FIG. 5B). The dimensions of the openings 53 formed on the dry film resist 52 are set to be larger than the dimensions of the openings 15 formed on the insulating resin layers 14 and 50.

Next, the metal layer 20 is formed on each region that is not covered with the dry film resist 52 (see FIG. 5C). The metal layer 20 is formed on the seed layer 18 by, e.g., electrolytic plating that uses the seed layer 18 for electric-power feeding. The metal layer 20 is made of a metal whose melting point is higher than the melting point of the solder of the solder member 22. The thickness of the metal layer 20 is, e.g., 2 µm and may be within a range of 0.5 µm to 5 µm.

The metal layer 20 is shaped to have the bottom portion 20a and the cylindrical portion 20b formed integrally with the bottom portion 20a such that the cylindrical portion 20b is opened wide at an upper part thereof.

Next, the solder member 22 is formed on each metal layer 20 (see FIG. 6A). The solder member 22 is formed on the bottom portion 20a and in the cylindrical portion 20b of each metal layer 20 by filling solder on the metal layer 20 through the electrolytic plating that uses the seed layer 18 for electric-power feeding. Thus, the plural bump structures 24 are formed, which includes the metal layer 20 and the solder member 22 filled in the metal layer 20.

Next, the dry film resist 52 covering the top surface of the seed layer 18 on the insulating resin layer 50 is removed (see FIG. 6B).

Next, the seed layer 18 exposed on the insulating resin layer 50 is removed by flash etching (see FIG. 6C).

The entire chip-mounting-surface is polished and planarized by chemical mechanical polishing (CMP) (see FIG. 7A). The insulating resin layer 50, the metal layer 20 and the solder member 22 are polished until the metal layer 20 and the solder member 22 are not left on the insulating resin layer 50. Thus, the entire chip-mounting-surface is planarized.

Alternatively, when the entire surface is polished and planarized by chemical mechanical polishing (CMP), the seed layer 18 on the insulating resin layer 50 may be removed, without etching removal of the seed layer 18 by flash etching.

Next, the exposed insulating resin layer 50 is removed by a solvent (see FIG. 7B). The insulating resin layer 50 is selectively peeled using, e.g., an organic solvent. The insulating resin layer 14 is not peeled by an organic solvent. Thus, the insulating resin layer 14 is left.

Next, solder reflowing is performed, so that the top-part of the solder member 22 is rounded due to surface tension (see FIG. 7C). If Sn is used as the material of the solder member 22, the solder reflowing is performed by heating the solder member 22 to 250° C. The solder member 22 is molten by the solder reflowing. However, the metal layer 20 is not molten. Thus, only the top-part of the solder member 22 is rounded. The fundamental bump structure is not changed. Incidentally, the solder reflowing may be omitted.

Incidentally, in steps respectively illustrated in FIGS. 5B and 5C, the metal layer 20 may be formed on the entire surface of the seed layer 18 without using the dry film resist 52. In such a case, when the entire surface of the seed layer 18 is planarized by chemical mechanical polishing (CMP), without removing the seed layer 18 by flash etching (see FIG. 6C), the metal layer 20 and the seed layer 18 on the insulating resin layer 50 are removed by polishing.

Second Embodiment

A bump structure according to a second embodiment is described below with reference to FIGS. 8 to 13.

Wiring Substrate

Figure 8:
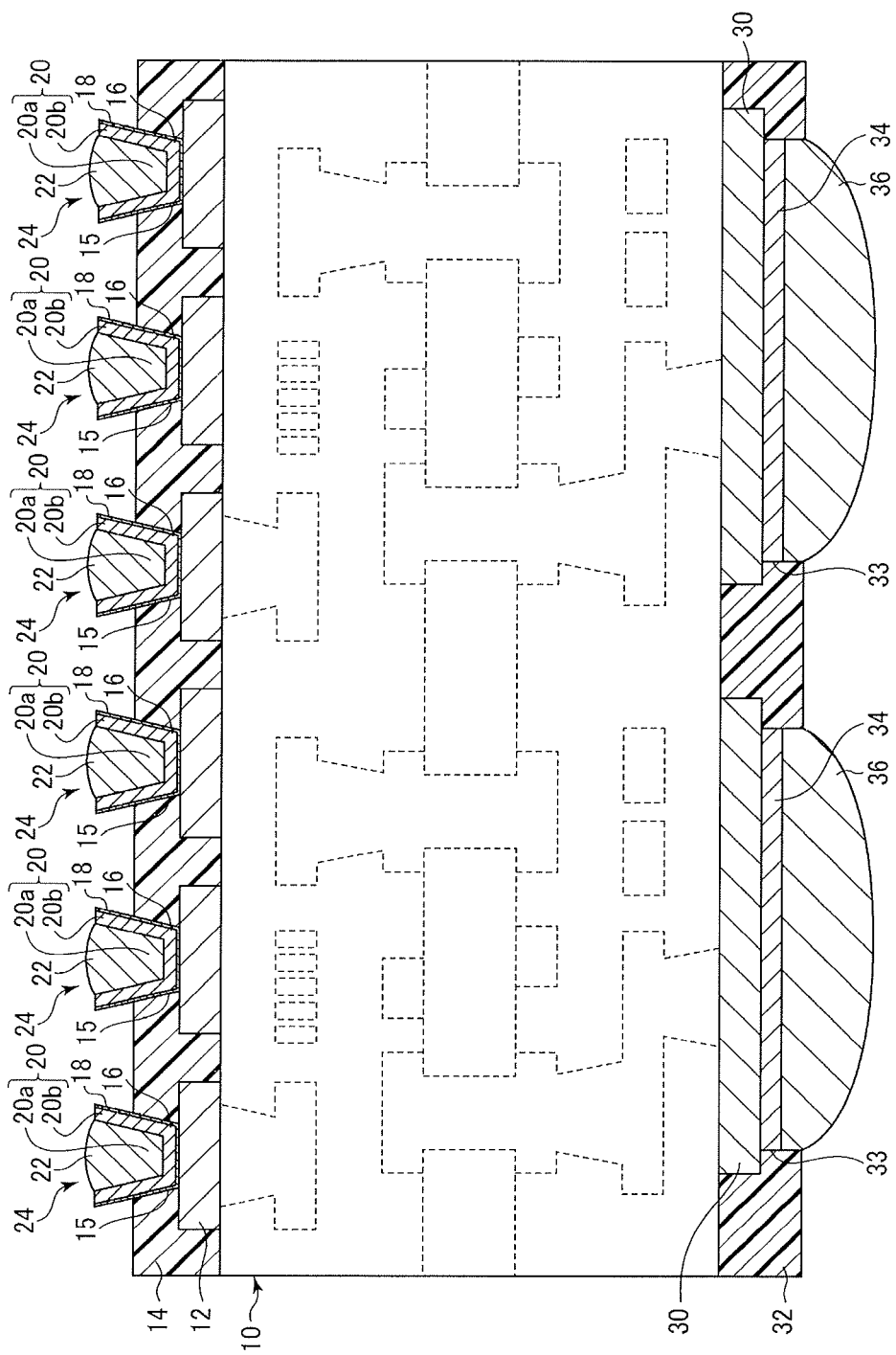
FIG. 8 is a cross-sectional diagram illustrating a wiring substrate having a bump structure according to a second embodiment.

A wiring substrate having a bump structure according to the second embodiment is described with reference to FIG. 8. FIG. 8 is a cross-sectional diagram illustrating a wiring substrate having a bump structure according to the present embodiment. Each component which is the same as that of the wiring substrate having the bump structure according to the first embodiment is designated with the same reference numeral that designates the same component of the wiring substrate according to the first embodiment. Thus the description of such a component is omitted or simplified.

The bump structure according to the second embodiment is featured in that the electrically-conductive layer 16 in the bump structure according to the first embodiment is not provided in the bump structure according to the second embodiment.

The internal structure of a wiring substrate 10 according to the present embodiment is indicated by dashed lines in FIG. 8. The detailed description of the internal structure of the wiring substrate 10 is omitted.

In FIG. 8, the top surface of the wiring substrate 10 is a chip-mounting-surface on which a semiconductor chip (not shown) is mounted. The bottom surface of the wiring substrate 10 is a motherboard-connection-surface connected to a motherboard (not shown).

Plural electrode pads 12 are formed on a chip-mounting-surface of the wiring substrate 10 at a small pitch compatible with the pitch of plural electrode posts (not shown) of a semiconductor chip (not shown) to be mounted.

On the chip-mounting-surface of the wiring substrate 10, an insulating resin layer 14 is formed so as to cover the entire electrode pads 12.

An opening 15 tapered to be opened wide at an upper part thereof is formed on each electrode pad 12 in the insulating resin layer 14.

Each metal layer 20 is formed via a seed layer 18 on the side wall of the tapered-shape opening 15 of the insulating resin layer 14. Each of the seed layer 18 and the metal layer 20 is protruded upwardly from the insulating resin layer 14. The metal layer 20 includes the bottom portion 20a and the cylindrical portion 20b that is formed integrally with the bottom portion 20a and opened wide at an upper part thereof. The solder member 22 is formed by filling the inside of the cylindrical portion 20b of the metal layer 20 with solder. The metal layer 20 is formed using a metal whose melting point is higher than the melting point of the solder member 22.

On the motherboard-connection-surface of the wiring substrate 10, which is connected to the motherboard, plural electrode pads 30 are formed at a pitch compatible with the pitch of plural electrodes (not shown) of the motherboard (not shown) on which the wiring substrate 10 is mounted.

The opening 33 is formed on each electrode pad 30 in the insulating layer 32. The electrically-conductive layer 34 is formed on each electrode pad 30.

For example, in FIG. 8, the electrically-conductive layer 34 is a Ni/Pd/Au plating layer in which Ni-layer, Pd-layer, and Au-layer are stacked sequentially from the top side.

The solder member 36 is formed on each electrically-conductive layer 34.

Semiconductor Apparatus

Figure 9:
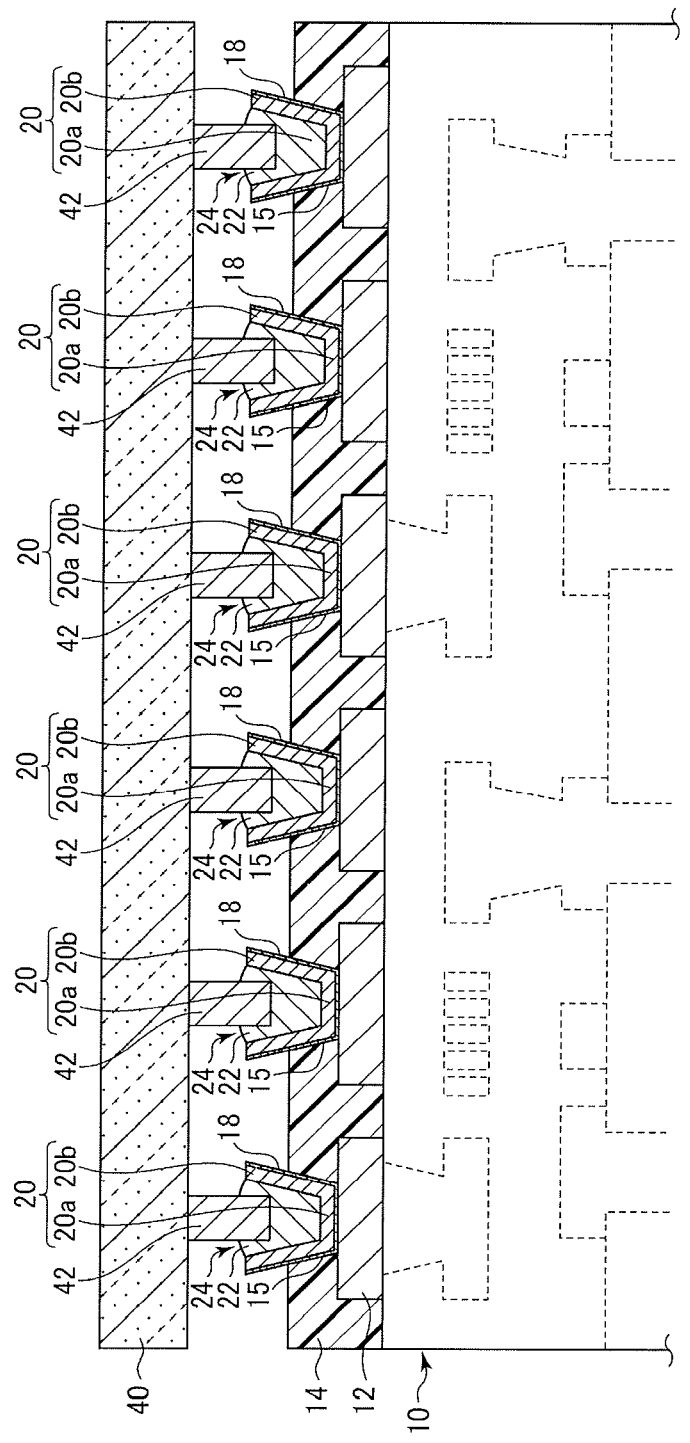
FIG. 9 is a cross-sectional diagram illustrating a semiconductor apparatus configured such that a semiconductor chip is mounted on the wiring substrate having the bump structure according to the second embodiment.

A semiconductor apparatus configured by mounting a semiconductor chip on a wiring substrate having a bump structure according to the present embodiment is described below with reference to FIG. 9. FIG. 9 is a cross-sectional diagram illustrating a semiconductor apparatus that a semiconductor chip is mounted on a wiring substrate having a bump structure according to the present embodiment. Each component which is the same as that according to the semiconductor apparatus that the semiconductor chip is mounted on the wiring substrate having a bump structure according to the first embodiment is designated with the same reference numeral that designates the same component. Thus, the description of such a component is omitted or simplified.

As illustrated in FIG. 9, the plural electrode posts 42 are formed at a small pitch on the semiconductor chip 40 to be mounted. The electrode post 42 is, e.g., a columnar electrode post formed by copper-plating or the like. The plural electrode pads 12 on the chip-mounting-surface of the wiring substrate 10 are formed at a pitch such that this pitch is compatible with the pitch of the plural electrode posts 42 of the semiconductor chip. The plural bump structures 24 each including the metal layer 20 and the solder member 22 are respectively formed on the plural electrode pads 12.

The plural electrode posts 42 on the semiconductor chip 40 are respectively joined to the plural bump structures 24 on the wiring substrate 10.

Thus, a semiconductor apparatus is formed by mounting the semiconductor chip 40 on the wiring substrate 10.

As described above, according to the present embodiment, advantages similar to those of the first embodiment are obtained. For example, each solder member 22 is covered around with the metal layer 20 whose melting point is higher than the melting point of solder. Thus, when the electrode posts 42 on the semiconductor chip 40 are respectively connected to the solder members 22, the molten solder member 22 can be prevented from being crushed and being laterally spread. In addition, because the solder member 22 is covered around with the metal layer 20, the growth of whisker due to the recrystallization of solder can be suppressed. Accordingly, the adjacent solder members 22 can be prevented electrically connected and short-circuited by the crushed solder member 22 or the whisker growing from the solder member 22.

According to the present embodiment, the electrically-conductive layers 16 in the bump structures according to the first embodiment are not provided. Thus, the electrical resistance between the bump structure 24 and the electrode pad 12 can be reduced. Consequently, the electrical characteristics of the semiconductor apparatus can be improved.

In addition, because the electrically-conductive layer 16 in the bump structure according to the first embodiment is not provided, the cylindrical portion 20b of the metal layer 20 can be formed more deeply by an amount corresponding to the non-existent electrically-conductive layer 16. Thus, if the distance of the semiconductor chip 40 to the wiring substrate 10 is too short, the electrode post 42 on the semiconductor chip 40 can be more prevented, for the deeply formed cylindrical portion 20b, from contacting with the bottom portion 20a of the metal layer 20 so as to damage the electrode post 42 and the metal layer 20.

In addition, because the electrically-conductive layer 16 in the bump structure according to the first embodiment is not provided, the consistent-contact between the seed layer 18 and the electrode pad 12 can be enhanced.

Bump Structure Manufacturing Method

A manufacturing method for a bump structure according to the present embodiment is described below with reference to FIGS. 10 to 13C. FIGS. 10 to 13C are process cross-sectional diagrams illustrating a method of manufacturing a bump structure according to the present embodiment. Each component which is the same as that according to the method of manufacturing the bump structure according to the first embodiment is designated with the same reference numeral that designates the same component of the wiring substrate according to the first embodiment. Thus the description of such a component is omitted or simplified.

First, the insulating resin layer 14 is formed to cover the entire electrode pads 12 serving as an outermost layer of the wiring substrate 10 (see FIG. 10A).

Next, on the insulating resin layer 14, an insulating resin layer 50 is formed, which differs from the insulating layer 14 in the peeling-property (see FIG. 10A).

Materials similar to the materials used in the method of manufacturing the bump structure according to the first embodiment can be used as those of the insulating resin layers 14 and 50.

Next, the opening 15 penetrating through the insulating resin layers 14 and 50 and reaching the electrode pad 12 is formed by laser processing (see FIG. 10B). Subsequently, a desmear treatment for removing a smear (i.e., a resin residue) generated by laser processing is performed. The desmear treatment is to remove a smear (i.e., a resin residue) using, e.g., a permanganic acid solution.

A laser-beam is attenuated in a depth direction. Thus, the shape of the opening 15 formed by laser processing is a shape tapered to be widened upward, as illustrated in FIG. 10B.

Then, according to the present embodiment, an electrically-conductive layer is not formed on each electrode pad 12 in the opening 15, while the electrically-conductive layer 34 is formed on each electrode pad 30 on the motherboard-connection-surface of the wiring substrate 10. According to the present embodiment, when the electrically-conductive layer 34 is formed on each electrode pad 30 on the motherboard-connection-surface of the wiring substrate 10, the chip-mounting-surface of the wiring substrate 10 is masked. Thus, an electrically-conductive layer is prevented from being formed on the chip-mounting-surface.

Next, the seed layer 18 is formed on the entire surface of each electrically-conductive layer 16 (see FIG. 11A).

Next, the entire surface of the seed layer 18 is coated with the dry film resist (DFR) 52. Then, patterning is performed on the dry film resist 52 to cover with exposure and development the top surface of the seed layer 18 on the insulating resin layer 50 and to form an opening 53 from which a region including the opening 15 on the electrode pad 12 is exposed (see FIG. 11B). The dimensions of the openings 53 formed on the dry film resist 52 are set to be larger than the dimensions of the openings 15 formed on the insulating resin layers 14 and 50.

Next, the metal layer 20 is formed on an area which is not covered by the dry film resist 52 (FIG. 11C). The metal layer 20 is made of a metal whose melting point is higher than the melting point of the solder of the solder member 22.

The metal layer 20 is shaped to have the bottom portion 20a and the cylindrical portion 20b formed integrally with the bottom portion 20a such that an upper part of the cylindrical portion 20b is opened wide.

Figure 12A:
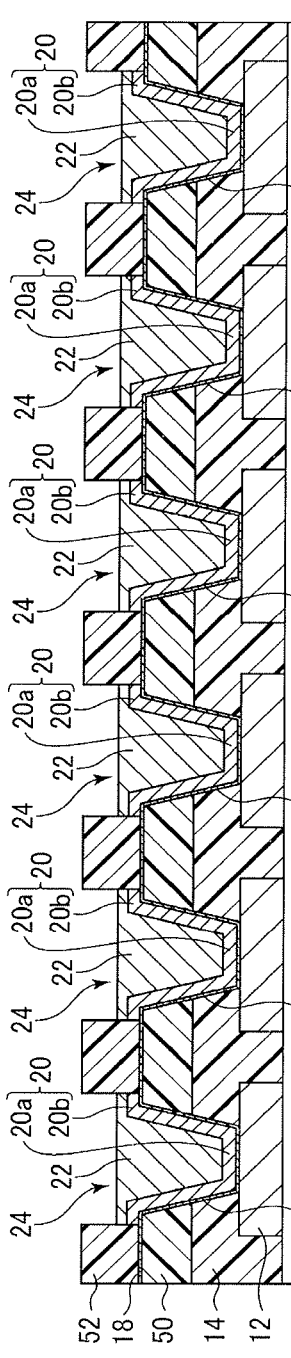

Next, the solder member 22 is formed on each metal layer 20 (see FIG. 12A).

Figure 12B:
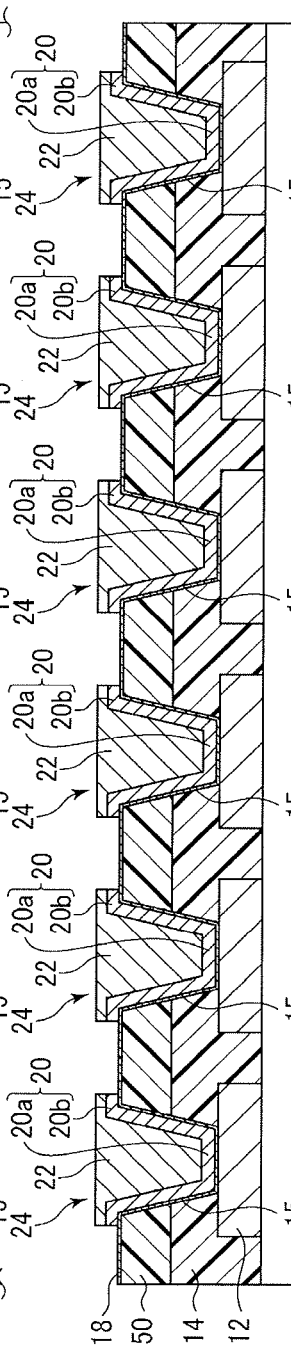

Next, the dry film resist 52 covering the top surface of the seed layer 18 on the insulating resin layer 50 is removed (see FIG. 12B).

Figure 12C:
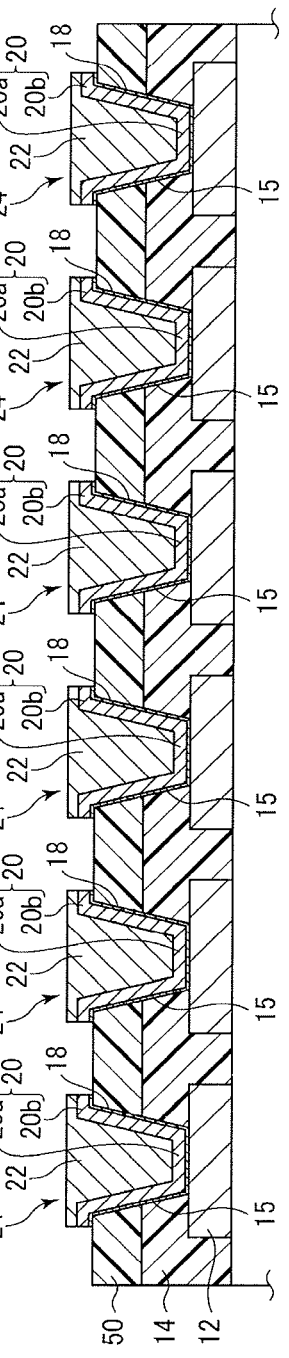

Next, the seed layer 18 exposed on the insulating resin layer 50 is removed by flash etching (see FIG. 12C).

The entire chip-mounting-surface is polished and planarized by chemical mechanical polishing (CMP) (see FIG. 13A).

The seed layer 18 on each insulating resin layer 50 may be removed when the entire chip-mounting-surface is polished and planarized by chemical mechanical polishing (CMP), without removing the seed layer 18 by flash etching, after the dry film resist 52 is removed.

Next, the exposed insulating resin layer 50 is removed by a solvent (see FIG. 13B). The insulating resin layer 50 is selectively peeled using, e.g., an organic solvent. The insulating resin layer 14 is not peeled off by an organic solvent. Thus, the insulating resin layer 14 is left.

Next, solder reflowing is performed, so that the top-part of the solder member 22 is rounded due to surface tension (see FIG. 13C). Incidentally, the solder reflowing may be omitted.

Third Embodiment

A bump structure according to a third embodiment is described below with reference to FIGS. 14 to 15C.

Wiring Substrate

A wiring substrate having a bump structure according to the third embodiment is described with reference to FIG. 14. Each component which is the same as that of the wiring substrate having the bump structure according to the first embodiment is designated with the same reference numeral that designates the same component of the wiring substrate according to the first embodiment. Thus the description of such a component is omitted or simplified.

The bump structure according to the present embodiment is featured in that the bump structure according to the third embodiment differs in shape from the bump structure according to the first embodiment.

Figure 14:
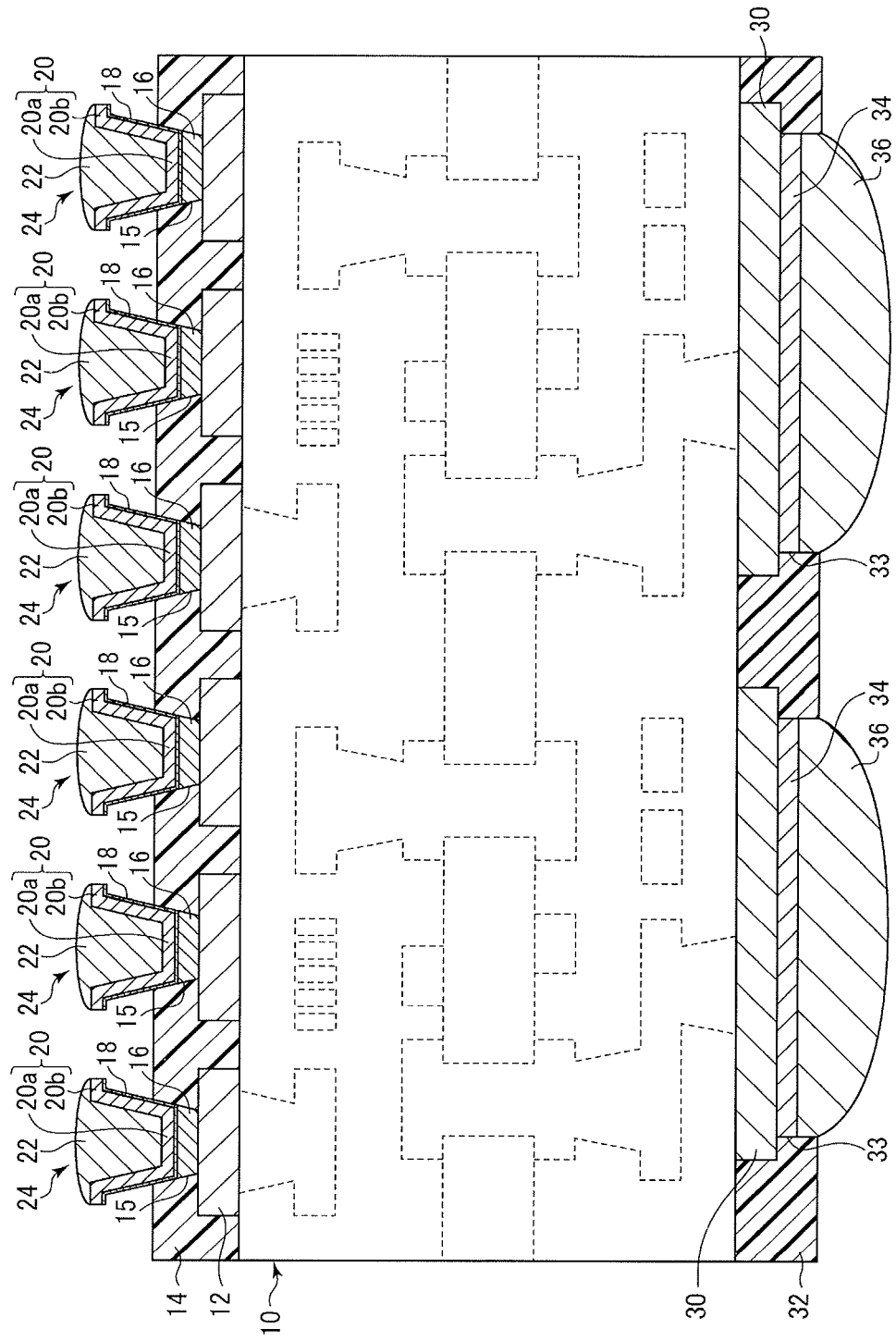
FIG. 14 is a cross-sectional diagram illustrating a wiring substrate having a bump structure according to a third embodiment.

The internal structure of the wiring substrate 10 according to the present embodiment is indicated by dashed lines in FIG. 14. The detailed description of the internal structure of the wiring substrate 10 is omitted.

In FIG. 14, the top surface of the wiring substrate 10 is a chip-mounting-surface on which a semiconductor chip (not shown) is mounted. The bottom surface of the wiring substrate 10 is a motherboard-connection-surface connected to a motherboard (not shown).

Plural electrode pads 12 are formed on the chip-mounting-surface of the wiring substrate 10 at a small pitch compatible with the pitch of plural electrode posts (not shown) of a semiconductor chip (not shown) to be mounted.

On the chip-mounting-surface of the wiring substrate 10, the insulating resin layer 14 is formed.

The opening 15 tapered such that an upper part is opened wide is formed on each electrode pad 12 in the insulating resin layer 14.

Each metal layer 20 is formed via the seed layer 18 on the side wall of the tapered-shape opening 15 of the insulating resin layer 14. Each of the seed layer 18 and the metal layer 20 is protruded upwardly from the insulating resin layer 14. The metal layer 20 includes the bottom portion 20a and the cylindrical portion 20b that is formed integrally with the bottom portion 20a and opened wide at an upper part. According to the present embodiment, the top-part of the cylindrical portion 20b is extended in a direction perpendicular to the central axis of the cylindrical portion 20b.

The solder member 22 is formed by filling the inside of the cylindrical portion 20b of the metal layer 20 with solder. The metal layer 20 is formed using a metal whose melting point is higher than the melting point of the solder member 22.

On the motherboard-connection-surface of the wiring substrate 10, plural electrode pads 30 are formed at a pitch compatible with the pitch of plural electrodes (not shown) of a motherboard (not shown) on which the wiring substrate 10 is mounted.

The pitch of the plural electrode pads 30 is compatible with the pitch of plural electrodes (not shown) on the motherboard (not shown).

The insulating layer 32 is formed on the motherboard-connection-surface of the wiring substrate 10 to cover the electrode pads 30.

The opening 33 is formed on each electrode pad 30 in the insulating layer 32. The electrically-conductive layer 34 is formed on each electrode pad 30.

The solder member 36 is formed on each electrically-conductive layer 34.

As described above, according to the present embodiment, advantages similar to those of the first embodiment are obtained. For example, each solder member 22 is covered around with the metal layer 20 whose melting point is higher than the melting point of solder. Thus, when the electrode posts 42 on the semiconductor chip 40 are respectively connected to the solder members 22, the molten solder member 22 can be prevented from being crushed and being laterally spread. In addition, because the solder member 22 is covered around with the metal layer 20, the growth of whisker due to the recrystallization of solder can be suppressed. Accordingly, the adjacent solder members 22 can be prevented electrically connected and short-circuited by the crushed solder member 22 or the whisker growing from the solder member 22.

In addition, according to the present embodiment, the top-part of the cylindrical portion 20b of the metal layer 20 is extended in a direction perpendicular to the central axis of the cylindrical portion 20b. Thus, as compared with the bump structures according to the first embodiment and the second embodiment, the substantial joint portion of the bump structure is more enlarged. Even if a deviation of the formation-position, at which each bump structure is formed, from the corresponding electrode post 42 on the semiconductor chip 40 occurs, each bump structure 24 can favorably be connected to the corresponding electrode 42.

Bump Structure Manufacturing Method

A manufacturing method for a bump structure according to the present embodiment is described below with reference to FIG. 15. FIG. 15 is a process cross-sectional diagram illustrating a method of manufacturing a bump structure according to the present embodiment. Each component which is the same as that according to the method of manufacturing the bump structure according to the first embodiment is designated with the same reference numeral that designates the same component of the wiring substrate according to the first embodiment. Thus the description of such a component is omitted or simplified.

The steps illustrated in FIGS. 4A to 6C of the method of manufacturing the bump structure according to the third embodiment are similar to the corresponding steps of the method of manufacturing the bump structure according to the first embodiment.

The seed layers 18 exposed on the insulating resin layer 50 are removed by flash etching (see FIG. 15A), similarly to a case illustrated in FIG. 6C. Then, the exposed insulating resin layer 50 is removed by a solvent (see FIG. 15B). Consequently, the seed layers 18 and the metal layers 20 are protruded upwardly from the insulating resin layer 14. Each metal layer 20 includes the bottom portion 20a, and the cylindrical portion 20b that is formed integrally with the bottom portion 20a and opened wide at an upper part. According to the third embodiment, the top-part of the cylindrical portion 20b is extended in a direction perpendicular to the central axis of the cylindrical portion 20b.

Figures 15A, 15B, 15C:
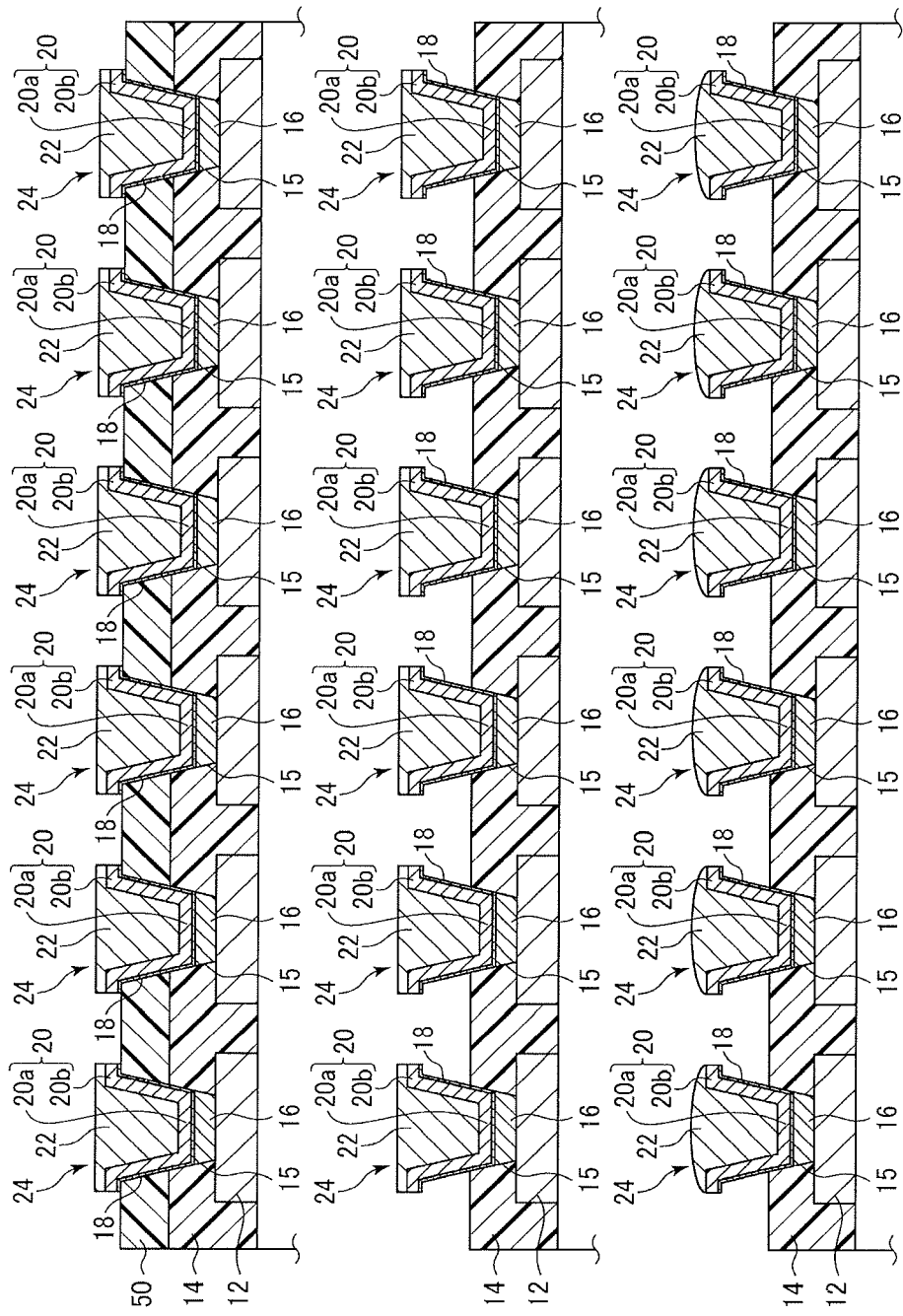
FIGS. 15A to 15C are process cross-sectional diagrams illustrating a method of manufacturing the bump structure according to the third embodiment.

Next, solder reflowing is performed, so that the top-part of the solder member 22 is rounded due to surface tension (see FIG. 15C). Incidentally, the solder reflowing may be omitted.

Modified Embodiments

The above embodiments are examples. Various modifications of the above embodiments can be made, if necessary.

For example, according to the above embodiments, the bump structures are formed on the electrode pads on the wiring substrate. However, the bump structure may be formed on the pad of the semiconductor chip.

In addition, any types of interconnection substrates, such as a single-sided board configured so that a pattern is provided on only a single side, a double-sided board configured so that patterns are respectively provided on both sides, a multi-layer wiring substrate configured by stacking insulating-layers and wiring-layers, an interposer relaying between the semiconductor chip and a circuit board, can be used as the wiring substrate.

The wiring substrate is not limited to a buildup substrate using an insulating layer made of resin, and a core substrate. Various types of wiring substrates, such as a coreless substrate, may be used.

According to the above embodiments, the wiring substrate is connected to the motherboard via the solder member (solder bump). However, other methods, such as a pin contact method and a wire bonding method, may be used.

Various aspects of the subject matter described herein are set out non-exhaustively in the following numbered clauses:

1. A method of manufacturing a bump structure provided on an electrode pad, comprising:
forming a first resin layer on the electrode pad;
forming, on the first resin layer, a second resin layer differing in peeling-property from the first resin layer;
forming, in each of the first resin layer and the second resin layer, a first opening whose upper part is opened wide;
forming, on an inner wall of the first opening, a metal layer made of a metal which is higher in melting-point than a solder member;
filling the solder member in the metal layer; and
removing the second resin layer.

2. The method of manufacturing a bump structure according to claim 1, further comprising:
planarizing an entire surface after filling the solder member and before removing the second resin layer.

3. The method of manufacturing a bump structure according to claim 1, further comprising:
forming a resist layer in which a second opening including the first opening is formed on the second resin layer, after forming the first opening and before forming the metal layer;
forming the metal layer using the resist layer as a mask in the forming of the metal layer;

filling the solder member using the resist layer as a mask in the filling of the solder member; and peeling the resist layer after filling the solder member and before removing the second resin layer.

The preferred embodiments of the invention have been described above in detail. However, the invention is not limited to the embodiments described above. Various modifications and alteration to the embodiments described above can be made within the scope of gist described in claims.

What is claimed is:

1. A bump structure provided on an electrode pad, comprising:

a solder member; and a metal layer having a cylindrical portion covering a side surface of the solder member and a bottom portion covering a bottom surface of the solder member, the metal layer being made of a metal which is higher in melting point than the solder member, wherein an upper part of the cylindrical portion of the metal layer is opened wide, the bottom portion of the metal layer is electrically connected to the electrode pad, a bottom-side-part of the metal layer is embedded in an insulating resin layer formed on the electrode pad, and a top-side-part of the metal layer is protruded from the insulating resin layer, a top-part of the cylindrical portion of the metal layer is extended in a direction perpendicular to a central axis of the cylindrical portion, and the top-part of the cylindrical portion of the metal layer that is extended in the direction perpendicular to the central axis of the cylindrical portion is not in contact with the insulating resin layer.

2. The bump structure according to claim 1, wherein the solder member is shaped like an inverted truncated-cone, whose upper part is wide.

3. The bump structure according to claim 1, wherein:

the solder member is made of Sn, Sn—Zn alloy, Sn—Cu alloy, Sn—In alloy, or Sn—Ag alloy; and the metal layer is made of Ni or Co.

* * * * *